(12) United States Patent
Day et al.

(10) Patent No.: US 7,259,584 B1
(45) Date of Patent: Aug. 21, 2007

(54) METHODS AND STRUCTURE FOR SELECTIVE IMPEDANCE CONTROL OF BUS DRIVER CIRCUITS

(75) Inventors: Brian Day, Colorado Springs, CO (US); Richard Solomon, Colorado Springs, CO (US)

(73) Assignee: LSI Corporation, Milpitas, CA (US)

( * ) Notice: Subject to any disclaimer, the term of this patent is extended or adjusted under 35 U.S.C. 154(b) by 185 days.

(21) Appl. No.: 11/061,073

(22) Filed: Feb. 18, 2005

(51) Int. Cl.
*H03K 17/16* (2006.01)
*H03K 19/003* (2006.01)
*G06F 13/36* (2006.01)

(52) U.S. Cl. .............. 326/30; 326/26; 326/31; 710/313; 710/314; 710/315

(58) Field of Classification Search .......... 326/26, 326/30–31; 710/100, 313–315
See application file for complete search history.

(56) References Cited

U.S. PATENT DOCUMENTS 6,380,758 B1* 4/2002 Hsu et al. ................. 326/30

* cited by examiner

*Primary Examiner*—James Cho
*Assistant Examiner*—Jason Crawford
(74) *Attorney, Agent, or Firm*—Duft, Bornsen & Fishman

(57) ABSTRACT

Methods and apparatus for selectively allowing and disallowing changes to an impedance control signal applied to bus driver circuits coupling a device or system to a common, shared bus where impedance of the bus may vary over time. Well known impedance sensing circuits may be coupled to a common bus, such as a PCI bus, and may be used to generate an impedance control signal to be applied to well-known bus driver circuits, including, for example, PCI bus driver circuits, to vary the drive level of such bus driver circuits in accordance with the present electrical impedance sensed on the bus. Features and aspects hereof permit selectively allowing and disallowing changes to such impedance control signals as applied to the driver circuits based upon the present state of the bus and/or the present state of signals driven on the bus by the system embodying the features and aspects hereof.

4 Claims, 1 Drawing Sheet

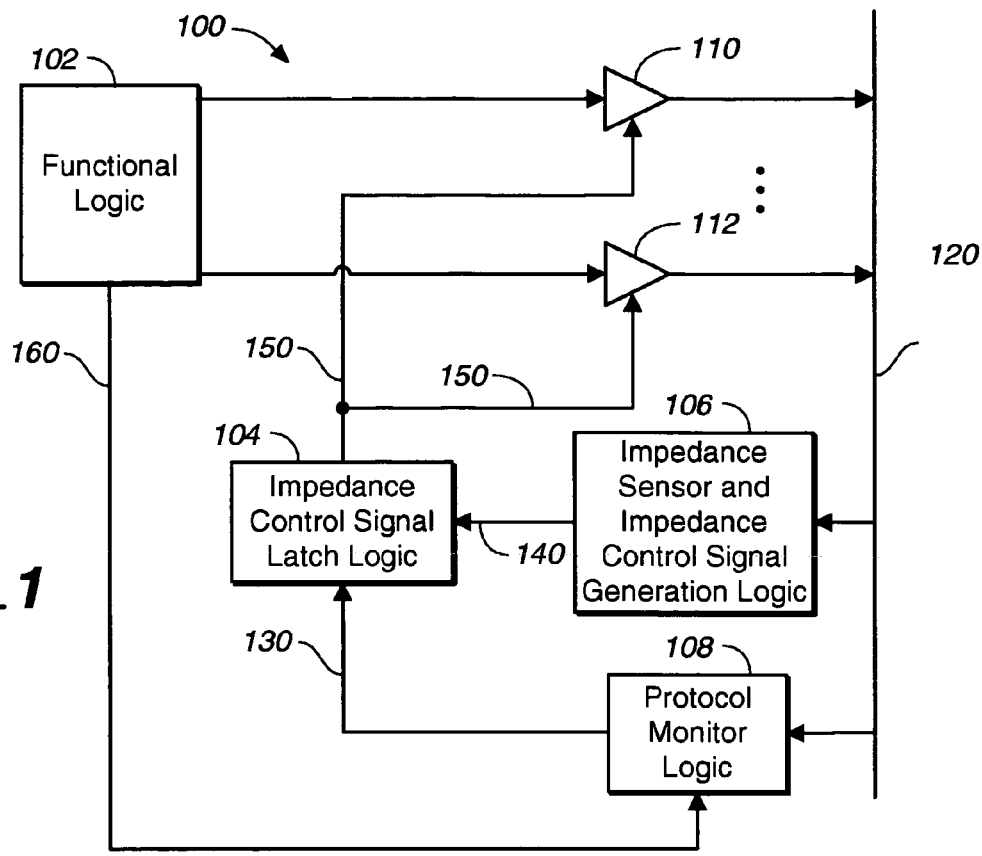
FIG._1
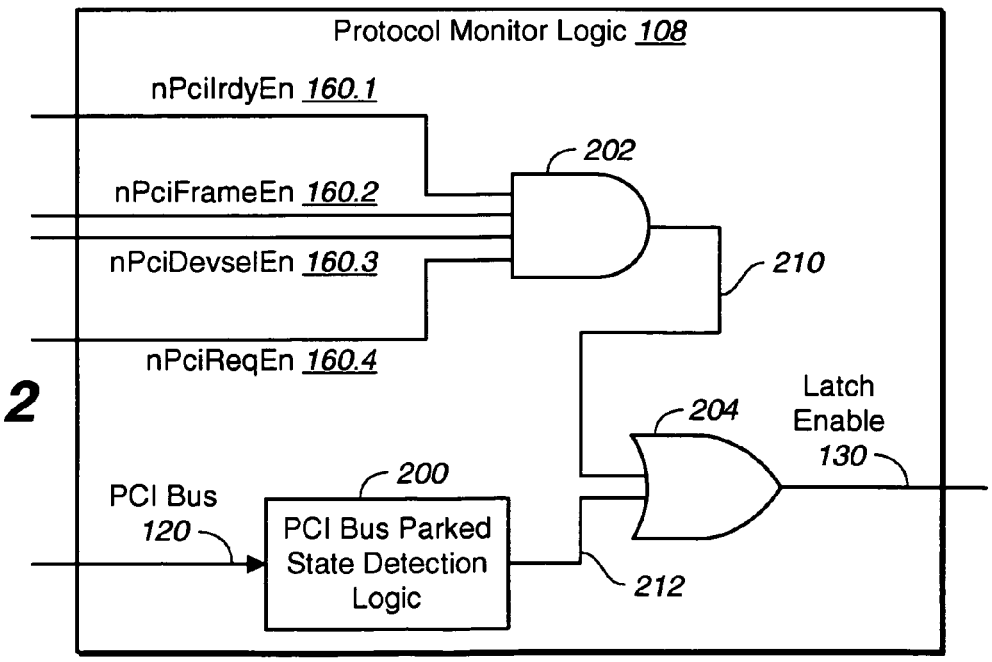
FIG._2

METHODS AND STRUCTURE FOR SELECTIVE IMPEDANCE CONTROL OF BUS DRIVER CIRCUITS

BACKGROUND OF THE INVENTION

1. Field of the Invention

The present invention relates generally to bus driver circuits and associated methods and systems and more specifically relates to methods and apparatus to selectively allow and disallow changes to a impedance control signal applied to bus driver circuits.

2. Discussion of Related Art

It is generally known in electronics to couple multiple devices to a common, shared bus structure. Signals may be driven on the bus by one or more devices coupled thereto and may be received by one or more devices coupled thereto. Thus, a device may exchange information via the shared bus structure with one or more other devices coupled to the shared bus structure. Numerous commercial bus structures are well known to those of ordinary skill in the art including, for example, several variants of the Peripheral Computer Interconnect bus standards may be useful (e.g., PCI bus specifications as generally available at www.pcisig.org).

In many such electronic bus structures, electrical impedance characteristics of various signal paths may change depending on a number of environmental and application specific parameters associated with the system. Impedance may change due to environment factors such as changes in operating temperatures or supplied reference voltages or may change based on system configuration such as the number of receiving devices coupled to a particular bus signal path, etc. As such factors may vary over time, impedance mismatch conditions may arise when exchanging signals between a transmitting or generating device and a receiving device. Such impedance mismatches may result in so-called "reflections" (e.g., voltage reflections) of signals applied to various conductive paths. Such signal reflections represent noise in the exchange of information and may disrupt proper exchange of information or even prevent proper communication between devices coupled to the shared bus.

It is also the generally known in various commercial and custom bus structures to use driver circuits for generating and applying signals to the various conductive paths of the common, shared bus. In particular, impedance controlled driver circuits are frequently used where impedance characteristics of bus signals may frequently or dramatically change in a particular application. For example, where receiving devices may frequently be added or removed from a common shared bus structure, it may be useful to use impedance controlled bus driver circuits so that devices designed to drive signals on the bus may adapt to the frequent changes in impedance. Also, systems intended to operate over a wider range of temperatures or voltage conditions may experience dramatic shifts in signal path impedance. Such applications may also benefit from well-known impedance controlled bus driver circuits. Impedance controlled bus driver circuits are generally known to those of ordinary skill in the art. One such exemplary impedance controlled bus driver circuit is discussed at: "www.lsilogic.com/products/pci_x_2_0/". Numerous similar circuits are readily available and documented from other commercial vendors and may be custom designed by an engineer in a specific application.

In general, impedance controlled bus driver circuits receive an impedance control signal from external circuits indicating a current impedance level setting used by the bus driver circuit to adapt its signal driving characteristics to the present level of impedance on the bus. Impedance sensor and control circuits may determine the present level of impedance for one or more signals on the shared bus and may generate the control signal for application to the impedance control driver circuits. A common approach for such an impedance control signal is the use of a bit field representing a binary encoded current level of impedance. Such a bit field may be one or more bits used to encode the present impedance level on the shared bus into one of a number of discrete impedance level values. For example, where an impedance control signal is a four bit signal, a binary encoded values of zero may represent a low or minimum impedance setting for the bus driver while a binary encoded value of fifteen (i.e., all ones in a four bit binary encoded field) may represent a maximum impedance setting for the bus driver circuit.

As the impedance sensing and control circuit monitors the common, shared bus structure for present impedance signals levels, it may change the impedance control signal applied to the various driver circuits. For example, in the case of an exemplary four bit binary encoded value as noted above, the nominal impedance setting may hover approximately at the midpoint of binary encoded values—i.e. at about seven or eight. Since this may represent the nominal operating range, transitions between, for example, a value of seven and eight may be frequent. If the value changes from seven, to eight, a problem may arise where invalid intermediate states of the impedance control signal may exist. For example a sensor may be changing the control settings from a value of seven to a value of eight and a brief intermediate state indicating all zeros may be sensed by the bus driver circuit. Thus, such an intermediate state could cause the bus driver circuit to inadvertently change its impedance setting briefly during application of a particular signal on the bus. An intermediate value of all zeros sensed by the bus driver circuit while driving a signal may cause the bus driver to dramatically shift its signal level during application of its driven signal to the shared bus structure. Such sudden shifts in the impedance setting of the bus driver circuit may cause precisely the kind of signal reflections intended to be avoided by the impedance control features of the bus driver circuit.

Those of ordinary skill in the art will readily recognize that transitions between a value of seven and eight in a four bit binary encoded field is merely exemplary of such a problem arising. More generally, any intermediate value or change in values during application of a driven signal to the bus may cause undesired reflections—precisely the problem to be avoided by use of impedance controlled bus driver circuits.

It is evident from the above discussion that a need exists for an improved method and apparatus to adapt a bus driver circuit to present impedance settings without causing unnecessary signal noise and reflections.

SUMMARY OF THE INVENTION

The present invention solves the above and other problems, thereby advancing the state of the useful arts, by providing methods and associated apparatus for selectively allowing and disallowing changes in the impedance control signal or signals applied to bus driver circuits on a shared bus structure. One aspect hereof provides that changes to the impedance setting signals applied to bus driver circuits will be modified only when the relevant bus structure is in an Idle state. As used herein, an "Idle state" of a bus is any state where changing the impedance control signal applied to a bus signal driver circuit would not risk erroneous bus transactions or any bus protocol violation. Another aspect hereof specific to exemplary embodiments involving PCI bus structures provides that the impedance control signal applied to the bus driver circuit is only allowed to be changed when the corresponding PCI bus is in an Idle state. More specifically, in one specific aspect hereof, the impedance control signal applied to a PCI bus driver circuit is allowed to change only when the underlying PCI bus is in a "Parked" state or when the PCI driver the device embodying the PCI driver to be controlled is not presently driving the PCI IRDY signal, the PCI FRAME signal, the PCI DEVSEL signal, or the PCI REQ signal.

A first feature hereof provides a gating circuit associated with impedance control signals applied to a bus driver circuit, the gating circuit comprising: sensing logic for sensing a need change an impedance control signal to be applied to the bus driver circuit; and gating logic coupled to the sensing logic for updating the impedance control signal to the driver circuit only when the bus associated with the bus driver circuit is Idle.

Another aspect hereof further provides that the bus is a PCI bus and wherein the driver circuit is a PCI bus driver circuit.

Another aspect hereof further provides that the gating logic includes: logic to allow updating of the impedance control signal to the PCI bus driver circuit only when the PCI bus is presently in the Parked state.

Another aspect hereof further provides that the gating logic includes: logic to allow updating of the impedance control signal to the PCI bus driver circuit only when the PCI bus driver circuit is not presently driving the PCI IRDY bus signal and is not presently driving the PCI FRAME bus signal and is not presently driving the PCI DEVSEL bus signal and is not presently driving the PCI REQ bus signal.

Another aspect hereof further provides that the gating logic includes: logic to disallow updating of the impedance control signal to the PCI bus driver circuit when the PCI bus driver circuit is presently driving the PCI IRDY bus signal.

Another aspect hereof further provides that the gating logic includes: logic to disallow updating of the impedance control signal to the PCI bus driver circuit when the PCI bus driver circuit is presently driving the PCI FRAME bus signal.

Another aspect hereof further provides that the gating logic includes: logic to disallow updating of the impedance control signal to the PCI bus driver circuit when the PCI bus driver circuit is presently driving the PCI DEVSEL bus signal.

Another aspect hereof further provides that the gating logic includes: logic to disallow updating of the impedance control signal to the PCI bus driver circuit when the PCI bus driver circuit is presently driving the PCI REQ bus signal.

Another feature hereof provides a system comprising: a PCI bus; a PCI bus driver circuit coupled to the PCI bus; a impedance control circuit coupled to the PCI bus driver circuit for generating an impedance control signal for application to the PCI bus driver circuit; and a protocol monitor circuit coupled to the PCI bus and coupled to the impedance control circuit for selectively allowing and disallowing update of the impedance control signal to be applied to the PCI bus driver circuit by the impedance control circuit.

Another aspect hereof further provides that the protocol monitor circuit includes: logic to allow updating of the impedance control signal to the PCI bus driver circuit only when the PCI bus is presently in the Parked state.

Another aspect hereof further provides that the protocol monitor circuit includes: logic to allow updating of the impedance control signal to the PCI bus driver circuit only when the PCI bus driver circuit is not presently driving the PCI IRDY bus signal and is not presently driving the PCI FRAME bus signal and is not presently driving the PCI DEVSEL bus signal and is not presently driving the PCI REQ bus signal.

Another feature provides a method for driving a bus comprising: operating a driver circuit coupled to the bus to drive a signal of the bus; generating an impedance control signal for application to the driver circuit to change the impedance of the signal driven on the bus by the driver circuit; and selectively allowing and disallowing update of the impedance control signal applied to the driver circuit based on the present state of the bus.

Another aspect hereof further provides that the bus is a PCI bus and provides that the step of selectively allowing and disallowing further comprises: allowing update of the impedance control signal only when the PCI bus is Idle.

Another aspect hereof further provides that the bus is a PCI bus and provides that the step of selectively allowing and disallowing further comprises: allowing update of the impedance control signal when the PCI bus is in the Parked state.

Another aspect hereof further provides that the bus is a PCI bus and further provides that the driver circuit is a PCI bus driver circuit and wherein the step of selectively allowing and disallowing further comprises: allowing update of the impedance control signal only when the PCI bus driver circuit is not presently driving the PCI IRDY bus signal and is not presently driving the PCI FRAME bus signal and is not presently driving the PCI DEVSEL bus signal and is not presently driving the PCI REQ bus signal.

BRIEF DESCRIPTION OF THE DRAWINGS

FIG. 1 is a schematic diagram of a system embodying features and aspects hereof to selectively allow and disallow changes in impedance control signals applied to bus driver circuits.

FIG. 2 is a schematic diagram providing additional details of an exemplary embodiment of a protocol monitoring element as shown in FIG. 1 embodying features and aspects hereof specifically applied to a PCI bus structure.

DETAILED DESCRIPTION OF THE DRAWINGS

FIG. 1 is a schematic diagram of a system 100 embodying features and aspects hereof to selectively allow and disallow changes in impedance control signals applied to bus driver circuits. Bus 120 may be any of several well-known bus structures including both commercially available bus structures and customized bus structures for particular applications. For example, bus 120 may be a PCI compliant bus structure and more specifically may be a PCI-X version 2.0 compliant bus structure. Specifications and standards for the PCI bus structures are well known to those of ordinary skill in the art and are generally available at www.pcisig.org.

Numerous devices may be coupled to such a bus structure including, for example, system 100 of FIG. 1. The devices communicate via the shared bus 120 to exchange information. As noted above, the number of devices coupled to bus 120 as well as other environmental considerations such as temperature or voltage may dynamically alter electrical impedance on various signal paths of bus 120. System 100 therefore includes bus driver circuits 110 and 112 configured to permit impedance control signals indicative of the level of impedance presently detected on bus 120. Driver circuits 110 and 112 may therefore adapt their driving characteristics for generating and applying signals to bus 120 to help reduce voltage reflections caused by changes in the impedance.

System 100 may include functional logic 102 that generates signals to be applied to bus 120 via bus drivers 110 and 112. Impedance sensor and impedance control signal generation logic element 106 monitors and measures impedance characteristics of signals on bus 120 to detect changes in the impedance thereon. Any of several well-known, commercially available sensing structures may be used to monitor the present level of impedance on one or more signals of bus 120. Impedance control signal generation logic portions of element 106 may then generate a control signal comprising one or more bits as a control signal output to its output path 140. For example, impedance control signal generation logic within element 106 may normalize the measured impedance between a low nominal level and a high nominal level and produce a binary encoded range of values representing the currently sensed impedance level on bus 120. More specifically, for example, a four bit output signal may be applied via to path 140 representing binary encoded values between zero and fifteen—zero representing a relatively low impedance level and fifteen representing a relatively high impedance level with intermediate values representing proportionately intermediate levels of impedance.

As noted above, impedance values may change on bus 120 completely asynchronously with respect to signals being driven by system 100 on to bus 120. If the impedance control signal generation logic portion of element 106 were to directly apply its control signal output to bus driver circuits 110 and 112, the impedance setting signal levels generated by the driver circuits 110 and 112 may be modified during generation and driving of a signal on bus 120. Such inopportune timing for modifying the drive level for bus driver circuits 110 and 112 may generate precisely the voltage reflections intended to be avoided by the controllable impedance setting of the driver circuits.

By contrast to prior techniques, system 100 includes latch logic 104 for latching the impedance control signal received as an input on path 140 and for applying a latched version of that signal on its output path 154 for application to driver circuits 110 and 112. Latch logic 104 therefore only applies latched versions of the present impedance control signal to the bus driver circuits 110 and 112 to thereby permit selective allowance and disallowance of changes in impedance control signal applied to bus driver circuits 110 and 112. When a latch enable signal is present on input path 130 of latch logic 104, the presently applied input value on path 140 is latched and applied as output to driver circuits 110 and 112 via path 150.

Protocol monitor logic 108 monitors a number of input signals including, for example, bus 120 and functional logic signals generated by a functional logic 102 received via input path 160. Protocol monitor logic 108 then determines from the present state of bus 120 and/or from the state of signals generated by functional logic 102 whether changes may be allowed or disallowed that this time for the impedance control signal applied to bus drivers 110 and 112. A latch enable signal is generated by protocol monitor logic 108 and applied to path 130 as a latch enable input to latch logic 104. When changes to the impedance control signal are allowed for application to bus drivers 110 and 112, a latch enable signal may be generated and applied to path 130. When changes to the impedance control signal should presently be disallowed based on either the state of signals on bus 120 or the state of signals generated by a functional logic 102, the signal applied to path 130 disables latch 104 from continuing to latch changes in the generated impedance control signal received on its path 140. Rather, the last latched impedance control signal will continue to be applied to its output path 150 until such time as protocol monitor logic 108 again allows impedance control signal at logic 104 to latch a new value for its impedance control signal to be applied to driver circuits 110 and 112.

Those of ordinary skill in the art will readily recognize numerous equivalent configurations wherein an impedance control signal may be generated and selectively allowed for application to bus driver circuits or selectively disallowed for application to bus driver circuits. Further, it will be apparent that protocol monitor logic 108 may monitor any signals associated with the bus being driven, and/or any signals within system 100 to determine appropriate states for allowing and disallowing application of changes to impedance control signals applied to driver circuits 110 and 112. Still further, the impedance control signal may be implemented as any number of bits including a single bit selecting one of two possible impedance level settings of bus drivers 110 and 112. Alternatively, the impedance control signal may be a multiple bit value with binary encoded level setting to be applied to the driver circuits. FIG. 1 is therefore intended merely as representative of one possible exemplary embodiment of a system 100 including features and aspects hereof to selectively allow and disallow changes in the impedance control signal applied to bus driver circuits.

FIG. 2 is a schematic diagram providing additional details of protocol monitor logic 108 of FIG. 1 for an exemplary embodiment related to PCI bus control and impedance. Logic 108 receives signals via path 160 from the functional logic elements described above with respect to FIG. 1. In particular, in the exemplary PCI bus embodiment shown in FIG. 2, four signals are received from the functional logic indicating that the functional logic is presently driving any of four particular internal functional signals each associated with a corresponding PCI bus signals defined in the PCI specifications: namely, nPciIrdyEn (160.1) active low indicates that the present system is driving the PCI bus IRDY signal; the nPciFrameEn (160.2) active low signal indicates that the present system is driving the PCI FRAME signal; nPciDevselEn active low signal (160.3) indicates that the present system is driving the PCI bus DEVSEL signal; and the nPciReqOut (160.4) active low signal indicates that the present system is driving the PCI REQ signal. If the functional logic of the present system is currently driving any of these for signals (active low), the impedance control signal presently latched as described above with respect to FIG. 1 should not be changed.

In addition, protocol monitor logic 108 of FIG. 2 receives signals from PCI bus 120 that indicate the present state of the PCI bus. If the PCI bus is presently in the "Parked" state (as well known to those skilled in the art and as documented in the PCI specifications), the impedance control signal presently latched as discussed above with respect to FIG. 1 should not be changed at this time.

In the particular example shown in FIG. 2, the four above identified signals generated by functional logic on paths 160.1, 160.2, 160.3, and 160.4 are applied as inputs to AND gate 202. The output of AND gate 202 is applied via path 210 to an input path of OR gate 204. In addition, PCI bus 120 signals indicative of the present PCI bus state are applied as input to PCI bus parked state detection logic 200.

PCI bus parked state detection logic 200 comprises suitable combinatorial logic to detect that the PCI bus is presently in the "Parked" state. Such combinatorial logic will be readily apparent to those of ordinary skill in the art. The output of the PCI bus parked state detection logic 200 is a signal indicating that the Parked state has been detected (active high) or not detected (inactive low). OR gate 204 receives the output of AND gate 202 and the output of PCI bus parked state detection logic 200 as inputs and generates the logical OR and applies the results as a latch enable signal to path 130.

The logic expressed as protocol monitor logic 108 in FIG. 2 may also be understood by the pool Boolean predicate:

LatchEnable=Parked OR
(nPciIrdyEn AND nPciFrameEn AND nPciDevselEn AND nPciReqOut)

where:

LatchEnable is an output signal applied to the latch storing the impedance control signal, Parked is an active low signal indicating the Parked state is presently sensed on the PCI bus, nPciIrdyEn is an active low signal indicating the functional logic is presently driving the PCI IRDY signal on the PCI bus, nPciFrameEn is an active low signal indicating the functional logic is presently driving the PCI FRAME signal on the PCI bus, nPciDevselEn is an active low signal indicating the functional logic is presently driving the PCI DEVSEL signal on the PCI bus, and nPciReqOut is an active low signal indicating the functional logic is presently driving the PCI REQ signal on the PCI bus.

Such Boolean logic as expressed above and as depicted in FIG. 2 may also be understood as a process or method of steps to selectively allow or disallow changes to the impedance control signal presently applied to bus driver circuits. Such a method or process will be readily apparent to those of ordinary skill in the art in view of the above figures, Boolean logic and discussion.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A gating circuit associated with impedance control signals applied to a bus driver circuit, the gating circuit comprising:

sensing logic for sensing a need to change an impedance control signal to be applied to the bus driver circuit wherein the bus is a PCI bus and wherein the driver circuit is a PCI bus driver circuit; and gating logic coupled to the sensing logic for updating the impedance control signal to the driver circuit only when the bus associated with the bus driver circuit is either in a PCI bus Idle state or is in a PCI bus Parked state, wherein the gating logic includes:

logic to allow updating of the impedance control signal to the PCI bus driver circuit only when the PCI bus driver circuit is not presently driving a PCI IRDY bus signal and is not presently driving a PCI FRAME bus signal and is not presently driving a PCI DEVSEL bus signal and is not presently driving a PCI REQ bus signal.

2. A gating circuit associated with impedance control signals applied to a bus driver circuit, the gating circuit comprising:

sensing logic for sensing a need to change an impedance control signal to be applied to the bus driver circuit wherein the bus is a PCI bus and wherein the driver circuit is a PCI bus driver circuit; and gating logic coupled to the sensing logic for updating the impedance control signal to the driver circuit only when the bus associated with the bus driver circuit is either in a PCI bus Idle state or is in a PCI bus Parked state, wherein the gating logic includes:

logic to disallow updating of the impedance control signal to the PCI bus driver circuit when the PCI bus driver circuit is presently driving any of the following PCI bus signals: a PCI IRDY bus signal, a PCI FRAME bus signal, a PCI DEVSEL bus signal, or a PCI REQ bus signal.

3. A system comprising:

a PCI bus;

a PCI bus driver circuit coupled to the PCI bus;

an impedance control circuit coupled to the PCI bus driver circuit for generating an impedance control signal for application to the PCI bus driver circuit; and a protocol monitor circuit coupled to the PCI bus and coupled to the impedance control circuit for selectively allowing and disallowing update of the impedance control signal to be applied to the PCI bus driver circuit by the impedance control circuit wherein the protocol monitor circuit is operable to allow update of the impedance control signal only when the PCI bus is either in an Idle state or is in a Parked state, wherein the protocol monitor circuit includes:

logic to allow updating of the impedance control signal to the PCI bus driver circuit only when the PCI bus driver circuit is not presently driving a PCI IRDY bus signal and is not presently driving a PCI FRAME bus signal and is not presently driving a PCI DEVSEL bus signal and is not presently driving a PCI REQ bus signal.

4. A method for driving a bus comprising:

operating a driver circuit coupled to the bus to drive a signal of the bus wherein the bus is a PCI bus and the driver circuit is a PCI bus driver circuit;

generating an impedance control signal for application to the driver circuit to change the impedance of the signal driven on the bus by the driver circuit; and selectively allowing and disallowing update of the impedance control signal applied to the driver circuit based on the present state of the bus wherein the step of selectively allowing is operable to allow update of the impedance control signal only when the PCI bus is either in an Idle state or is in a Parked state, wherein the step of selectively allowing and disallowing further comprises:

allowing update of the impedance control signal only when the PCI bus driver circuit is not presently driving a PCI IRDY bus signal and is not presently driving a PCI FRAME bus signal and is not presently driving a PCI DEVSEL bus signal and is not presently driving a PCI REQ bus signal.

* * * * *